(12) United States Patent
Ellingson

(10) Patent No.: US 6,259,253 B1
(45) Date of Patent: Jul. 10, 2001

(54) MRI TRANSCEIVER

(75) Inventor: Steven W. Ellingson, Columbus, OH (US)

(73) Assignee: Ohio State University Research Foundation, Columbus, OH (US)

( * ) Notice: Subject to any disclaimer, the term of this patent is extended or adjusted under 35 U.S.C. 154(b) by 0 days.

(21) Appl. No.: 09/329,507

(22) Filed: Jun. 10, 1999

(51) Int. Cl.[7] .............................. G01V 3/00; G01R 33/20
(52) U.S. Cl. ............................................................ 324/322
(58) Field of Search .................................. 324/322, 309, 324/307

(56) References Cited

U.S. PATENT DOCUMENTS 4,794,337 * 12/1988 Twieg ................................... 324/309
5,170,123 * 12/1992 Holland et al. ...................... 324/322

* cited by examiner

*Primary Examiner*—Jay Patidar
*Assistant Examiner*—Dixomara Vargas
(74) *Attorney, Agent, or Firm*—Standley & Gilcrest LLP

(57) ABSTRACT

A receiver and a transmitter for a MRI system and a method for converting a MR signal to digital data for use by a MRI system control/console and a method for generating RF excitation signals from the digital output of a MRI system control/console. The receiver and the transmitter for a MRI system adapted to work at field strengths up to about 8 T. The receiver has improved dynamic range and the capacity to work with MR signals that have a low signal to noise ratio. The receiver and transmitter enable the bandwidth to be varied over the range from about 2 kHz to about 1.5 MHz. The receiver and transmitter can accommodate a frequency range from about 10 MHz to about 400 MHz. Furthermore, the receiver and the transmitter have improved image rejection.

23 Claims, 5 Drawing Sheets

MRI TRANSCEIVER

This invention was made with Government support under Grant No. 9406073; DTFH61-92-X0026, awarded by NSF; NASTRB. The Government has certain rights in this invention.

BACKGROUND OF THE INVENTION

The present invention relates generally to magnetic resonance imaging. Magnetic resonance imaging (MRI) typically utilizes an RF transceiver and magnetic field gradient generation for spatial encoding. Various subsystems may be needed, such as magnetic field shimming and safety and the requisite software tools for signal and image processing. Encompassing all of this in a complex computer-controlled environment may require substantial effort. Although one can acquire a commercial spectrometer such as the Bruker AVANCE system, it is desirable to develop an improved system for reasons demonstrated below. The present invention relates to such a system.

One advantage to console development is the ability to incorporate new technology and solve problems in a timely fashion. For instance, known commercial spectrometer consoles may need development work in order to function with new technology. On the other hand, an improved MRI system may use newly introduced vendor-supplied devices for which the interfacing and control has not previously been incorporated into commercial spectrometer consoles.

The present invention allows experimentation at the lowest level in devising new strategies for maximum console performance. Multiple transceivers of the present invention may be used in a variety of ways: independent operation, multiple receivers using a single coil, multiple transmitters driving a single coil, etc. The gradient system of the present invention preferably supports large functions with fast and interactive adjustments. The preferred system data flow of the present invention will essentially remove image dimension barriers, and a new modular design of the present invention preferably lends itself to continuous improvement.

A spectrometer requires a receiver to convert magnetic resonance (MR) signals captured by a coil to digital data suitable for image rendering and spectral analysis. A transmitter is required to generate RF excitation signals from digital data. Because the function and design of the receiver and transmitter are closely related, they are referred to collectively as a transceiver. Known references that describe fundamental transceiver requirements deal primarily with MRI at field strengths of 3 T or less.

In UHFMRI (e.g., 8 T), the main challenge continues to be receiver design; specifically, reconciling the mutually exclusive goals of sensitivity, high dynamic range, and wide bandwidth. Sensitivity is an issue because MR signals are very weak, and therefore arrive at the receiver with low signal-to-noise ratio (S/N). Dynamic range emerges as an issue because it is often desired to observe very weak signals (such as spectral lines) in the presence of signals that can be about 110 dB stronger. A desire for increased bandwidth, up to about 1.5 MHz, arises from the extraordinary gradient strengths and performance available on a state-of-the-art 8 T system. However, the required sample rate increases with bandwidth, and the maximum bandwidth is not always required. Thus, the ability to vary the bandwidth over the range from about 2 kHz to about 1.5 MHz is desirable. Furthermore, it is preferred that the MRI transceiver is adapted to accommodate a wide frequency range, e.g., from about 10 MHz to about 400 MHz.

The design challenges for a UHFMRI transmitter include two of the key problems in receiver design: wide tuning range and image rejection. Image rejection is a significant consideration for the transmitter design because image signals from the transmitter will actually be radiated from the coil.

Because resonant frequency is proportional to magnetic field strength, transceivers for UHFMRI preferably accommodate a wider tuning range than traditional MRI transceivers. Resonant frequencies for some key isotopes at 1 T and 8 T are shown in Table 1. This table suggests a preferred minimum tuning range specification of about 30 MHz to about 350 MHz for an 8 T MRI.

TABLE 1

MR frequencies for key isotopes at 1 T and 8 T

| Isotope | Resonance at 1 T | Resonance at 8 T |
|---|---|---|
| $^{1}$H | 42.577 MHz | 340.616 MHz |
| $^{19}$F | 40.055 | 320.440 |
| $^{31}$P | 17.235 | 137.880 |
| $^{7}$Li | 16.547 | 132.376 |
| $^{11}$B | 13.660 | 109.280 |
| $^{23}$Na | 11.262 | 90.096 |
| $^{27}$M | 11.094 | 88.752 |
| $^{13}$C | 10.705 | 85.640 |
| $^{2}$H | 6.536 | 52.280 |
| $^{17}$O | 5.772 | 46.174 |
| $^{15}$N | 4.315 | 34.520 |

The purpose of an MR receiver is to produce a high-fidelity baseband digital representation of the MR signal suitable for computer analysis. Known analog-to-digital converters (A/Ds) cannot directly digitize signals at the frequencies associated with mid to ultra-high-field MR, so frequency downconversion is currently necessary. Downconversion involves mixing the MR signal with a local oscillator (LO) to produce sum and difference frequencies. Given an appropriate LO, the difference frequency (sometimes also called the intermediate frequency or "IF") will be low enough for digitization with known A/Ds. Because the performance of an A/D degrades with increasing frequency, there is an incentive to make the difference frequency as low as possible.

A fundamental problem in this method of downconversion is image rejection. For example, suppose that a "low-side" LO is used, i.e., the LO frequency $f_{LO}$ is less than the center frequency of the desired MR signal $f_{MR}$. In other words, $f_{MR}=f_{LO}+f_{IF}$, where $f_{IF}$ is the difference frequency. In this case, the receiver is also sensitive to the image frequency which is $f_{LO}-f_{IF}$. Any signals present in the image band will appear at the output as if they were originally in the desired sideband. Even if no signals are present in the image band, the image band noise appears at the output of the mixer and adds with the desired signal, thereby degrading S/N. This problem can be addressed by filtering the image band before mixing. However, this is difficult to do if $f_{IF}$ is small. This provides incentive for increasing the difference frequency, which runs counter to A/D capabilities.

Image rejection by filtering before mixing has other problems as well. One is that tuning the receiver becomes difficult because the image filter must also be tuned. Thus, an image rejection architecture may be helpful. Image-rejection downconversion schemes (also known as "single sideband" or "SSB" demodulators) are helpful in eliminating image energy over a wide tuning range without the need for tunable image filters. FIG. 1 shows a known image rejection scheme in which in-phase (I) and quadrature (Q) local oscillator (LO) signals are applied to the input signal, resulting in audio-frequency I and Q channels that contain both the desired sideband and the image. The image sideband can be canceled by shifting the phase of the I channel by ±90° (depending on which sideband is desired), and then summing the result to obtain a real signal. The 90° phase shift has the effect of putting the desired sideband in the I and Q channels in phase, and the undesired sideband in the I and Q channels 180° out of phase. Thus, the sum signal contains only the desired sideband.

In the MR field, a 40 dB image rejection in a 100 kHz bandwidth has been obtained using analog filters to implement the phase shift. In this scheme, the sources of error included amplitude and phase imbalance in the analog I/Q demodulator, and phase variation with frequency due to the audio phase shift circuit. It is particularly difficult to construct audio phase shift circuits that are invariant with frequency. This is primarily because phase shifts in real signals must be implemented as delays, and it is difficult to realize a filter with delay that varies precisely with frequency. As the fractional bandwidth (that is, the ratio of the bandwidth to the center (difference) frequency $f_{IF}$) becomes larger, this technique becomes more difficult.

For wideband MR signals, there are two ways to improve image rejection. One is to increase $f_{IF}$, reducing the fractional bandwidth and thereby simplifying the filter design. The other is to digitize the baseband I and Q channels and correct the amplitude and phase errors incurred in the analog I/Q demodulation using digital signal processing techniques. This can be computationally expensive, especially for high sample rates. The former suggestion also poses a problem because A/D performance generally degrades with increasing frequency and sample rate.

In light of the shortcomings of the known art, a need exists for a receiver and a transmitter that are adapted to work with MRI at field strengths up to about 8 T. Another need exists for a receiver that has improved capacity to work with MR signals that have a low S/N. A need also exists for a receiver that has improved dynamic range. Yet another need exists for a receiver and a transmitter that enable the bandwith to be varied over the range from about 2 kHz to about 1.5 MHz. Still another needs exists for a receiver and transmitter that can accommodate a frequency range from about 10 MHz to about 400 MHz. Finally, a need exists for a receiver and a transmitter that have improved image rejection.

SUMMARY OF THE INVENTION

The present invention satisfies some or all of the aforementioned needs. The present invention provides a receiver and a transmitter for an MRI system. The present invention also provides a method for converting a MR signal to digital data for use by a MRI system control/console and a method for generating RF excitation signals from the digital output of a MRI system control/console.

The receiver is adapted to convert a MR signal to digital data for use by a MRI system control/console. A preferred embodiment of the receiver has a local oscillator that is adapted to produce an I signal and a Q signal. A phase shifting device is in electrical communication with the local oscillator. The phase shifting device may be a quadrature hybrid. The phase shifting device is adapted to cause a 90° phase shift of the I signal. A first mixer is in electrical communication with the phase shifting device. The first mixer is adapted to mix the MR signal and the output of the phase shifting device. A second mixer is in electrical communication with the local oscillator. The second mixer is adapted to mix the MR signal and the Q signal. A first A/D is in electrical communication with the first mixer. The first A/D is adapted to digitize the output of the first mixer. A second A/D is in electrical communication with the second mixer. The second A/D is adapted to digitize the output of the second mixer. A first numerically controlled oscillator/modulator (NCOM) is in electrical communication with the first mixer. The first NCOM is adapted to downconvert the output of the first A/D to a first complex baseband signal. The first NCOM is further adapted to cause a 90° phase shift of the first complex baseband signal. A second NCOM is in electrical communication with the second mixer. The second NCOM is adapted to downconvert the output of the second A/D to a second complex baseband signal. An adder is in electrical communication with the first NCOM and the second NCOM. The adder is adapted to add the first complex baseband signal and the second complex baseband signal. A first digital decimation filter (DDF) is in electrical communication with the adder. The first DDF is adapted to decimate an I component of the output of the adder to a desired sample rate and a desired bandwith. A second DDF is also in electrical communication with the adder. The second DDF is adapted to decimate a Q component of the output of the adder to the desired sample rate and the desired bandwith. As a result, the outputs of the first DDF and the second DDF are adapted for use by the MRI system control/console.

The receiver preferably includes bandpass filters. A first bandpass filter may be placed in electrical communication with the first mixer, and a second bandpass filter may be placed in electrical communication with the second mixer. The first bandpass filter is adapted to filter the output of the first mixer, and the output of the first bandpass filter is input to the first A/D. Similarly, the second bandpass filter is adapted to filter the output of the second mixer, and the output of the second bandpass filter is input to the second A/D. This embodiment may further comprise means for improving the spurious-free dynamic range (SFDR). In particular, a dithering generator may be included that is adapted to add noise to the output of the first mixer and the output of the second mixer. The dithered outputs may then be filtered by the first and second bandpass filters.

The receiver may also include means to correct phase and amplitude imbalance which may occur due to variation in gain and electrical length between the analog mixer outputs and the A/D inputs. For example, the receiver may include a multiplier that is in electrical communication with the first NCOM. The multiplier is preferably a digital complex multiplier. The multiplier is preferably adapted to multiply the output of the first NCOM by a signal, e.g., a complex constant, from a digital signal processor to produce desired gain and phase corrections. The output of the multiplier may then be added to the output of the second NCOM by the adder.

A preferred embodiment of the receiver also includes a digital signal processor (DSP). The DSP is preferably in electrical communication with the first DDF and the second DDF such that it receives the outputs of the first DDF and the second DDF. The DSP may coordinate administrative, buffering, and data distribution tasks. In addition, the DSP is also preferably adapted to provide signal processing of the outputs of the first DDF and the second DDF.

The present invention also includes a method for converting a MR signal to digital data for use by a MRI system control/console. A preferred method begins by providing a MR signal, an I signal and a Q signal. The phase of the I signal is shifted by 90°. The phase-shifted I signal and the MR signal are then mixed to produce a first intermediate signal. The Q signal and the MR signal are also mixed to produce a second intermediate signal. The first intermediate signal is digitized to produce a third intermediate signal, and the second intermediate signal is digitized to produce a fourth intermediate signal. The third intermediate signal is downconverted to produce a first complex baseband signal, and the phase of the first complex baseband signal is shifted by 90°. The fourth intermediate signal is also downconverted to produce a second complex baseband signal. The phase-shifted first complex baseband signal and the second complex baseband signal are then added to produce an I component intermediate output and a Q component intermediate output. The I component intermediate output is decimated to an I component final output having a desired sample rate and a desired bandwidth, and the Q component intermediate output is decimated to a Q component final output having the desired sample rate and the desired bandwidth. As a result, the I component final output and the Q component final output are adapted for use by the MRI system control/console.

The first and second intermediate signals are preferably bandpass filtered prior to being digitized. In addition, the method may include dithering the first and second intermediate signals prior to filtering in order to improve SFDR.

The method may also include steps to improve or correct various signals. For instance, the phase-shifted first complex baseband signal may be multiplied by a suitable signal, e.g., a complex constant, to produce desired gain and phase corrections. The phase-shifted first complex baseband signal may then be added to the second complex baseband signal. For another example, signal processing may be performed on the I component final output and the Q component final output to improve these signals for use by the MRI system control/console.

The transmitter of the present invention is adapted to generate RF excitation signals from the digital output of a MRI system control/console. A preferred embodiment of the transmitter has a first digital interpolation filter (DIF) that is adapted to receive a first I signal from the MRI system control/console. The first DIF is adapted to interpolate the first I signal by a desired factor. The desired factor may be any power of 2, e.g., 16. A second DIF is adapted to receive a first Q signal from the MRI system control/console. The second DIF is adapted to interpolate the first Q signal by the desired factor. A first digital upconverter (DUC) and a second DUC are in electrical communication with the first DIF and the second DIF. The first DUC and the second DUC may each be comprised of a NCOM or any other appropriate device for performing digital upconversion. The first DUC has a first I input and a first Q input. The first I input of the first DUC is adapted to receive the output of the second DIF, and the first Q input of the first DUC is adapted to receive the output of the first DIF. The second DUC has a second I input and a second Q input. The second I input of the second DUC is adapted to receive the output of the first DIF, and the second Q input of the second DUC is adapted to receive the output of the second DIF. A first digital-to-analog converter (D/A) is in electrical communication with the first DUC. The first D/A is adapted to convert an I output of the first DUC to analog form. A second D/A is in electrical communication with the second DUC. The second D/A is adapted to convert a Q output of the second DUC to analog form. The transmitter includes a local oscillator or another suitable device which is adapted to produce a second I signal and a second Q signal. A phase shifting device, e.g., a quadrature hybrid, is in electrical communication with the local oscillator. The phase shifting device is adapted to cause a 90° phase shift of the second I signal. A first mixer is in electrical communication with the first D/A and the phase shifting device. The first mixer is adapted to mix the output of the first D/A and the output of the phase shifting device. A second mixer is in electrical communication with the second D/A and the local oscillator. The second mixer is adapted to mix the output of the second D/A and the second Q signal of the local oscillator. A combiner is in electrical communication with the first mixer and the second mixer. The combiner is adapted to add the outputs of the first mixer and the second mixer to produce a RF excitation signal.

The transmitter preferably includes lowpass filtering. A first lowpass filter may be placed in electrical communication with the first D/A, and a second lowpass filter may be placed in electrical communication with the second D/A. The first lowpass filter is adapted to filter the output of the first D/A, and the second lowpass filter is adapted to filter the output of the second D/A. The output of the first lowpass filter may then be input to the first mixer, and the output of the second lowpass filter is input to the second mixer.

A preferred embodiment of the transmitter may also include a DSP. The DSP is preferably placed in electrical communication with the first DIF and the second DIF for performing signal processing on the first I signal and the first Q signal. The first I signal and the first Q signal may then be input to the first DIF and the second DIF.

The present invention also includes a method for generating RF excitation signals from the digital output of a MRI system control/console. A preferred method is initiated by providing a first I signal and a first Q signal from the MRI system control/console. The first I signal is interpolated by a desired factor, e.g., 16, to produce a first intermediate digital signal, and the first Q signal is interpolated by the same desired factor to produce a second intermediate digital signal. A first DUC and a second DUC are provided. The first DUC has a first I input and a first Q input, and the second DUC has a second I input and a second Q input. The first intermediate digital signal is provided to the first Q input of the first DUC and the second I input of the second DUC. The second intermediate digital signal is provided to the first I input of the first DUC and the second Q input of the second DUC. The I output of the first DUC is then converted to a first intermediate analog signal, and the Q output of the second DUC is converted to a second intermediate analog signal. A second I signal and a second Q signal are generated by a local oscillator or any other suitable device. The phase of the second I signal is shifted by 90°. The phase-shifted second I signal and the first intermediate analog signal are mixed to produce a third intermediate analog signal. The second Q signal and the second intermediate analog signal are also mixed to produce a fourth intermediate analog signal. The third intermediate analog signal and the fourth intermediate analog signal are then combined to produce the RF excitation signal.

A preferred method includes lowpass filtering. For example, the first intermediate analog signal and the second intermediate analog signal may be lowpass filtered. After being filtered, the first intermediate analog signal may be mixed with the phase-shifted second I signal, and the second intermediate analog signal may be mixed with the second Q signal.

Another preferred method also includes digital signal processing. The first I signal and the first Q signal are preferably signal processed prior to being interpolated.

In addition to the novel features and advantages mentioned above, other objects and advantages of the present

Figure 1:
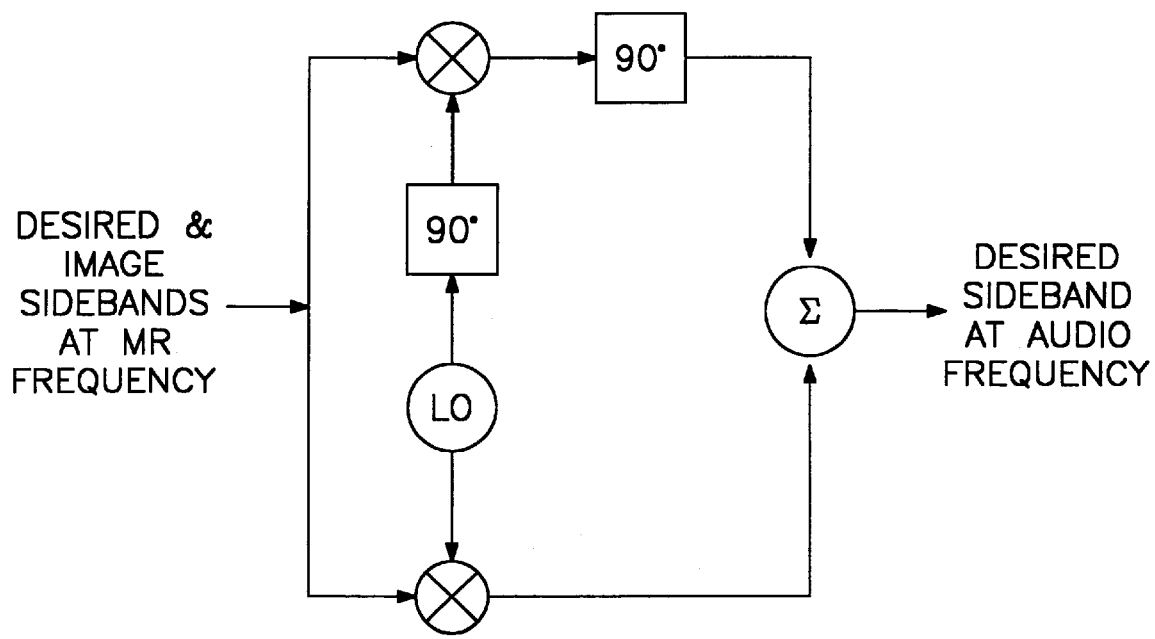
FIG. 1 is a diagram of a known narrowband image rejection downconversion scheme.

To acquire a signal with a 1.5 MHz bandwidth, a single A/D sampling at least 3 MSPS or two A/Ds sampling in quadrature at least 1.5 MSPS may be used. A selection of candidate A/Ds is shown in Table 2. The popular AD1382, which does not have sufficient speed for 1.5 MHz bandwidth, is also shown for comparison.

Table 2. Candidate A/Ds for acquisition of 1.5 MHz bandwidth. S/Ns for acquisition of 1.5 MHz and 2.5 kHz bandwidths are calculated assuming bandpass sampling at rated speed followed by digital filtering to reduce bandwidth. In each case, the dynamic range for 2.5 kHz is limited by SFDR, not S/N.

| A/D | Word Size | Rated Performance | | | For acquisition of 1.5 MHz bandwidth | For acquisition of 2.5 kHz bandwidth |
|---|---|---|---|---|---|---|
| | | Speed | S/N | SFDR | Dynamic Range | Dynamic Range |
| AD1382 | 16 bits | 0.5 MSPS | 93 dB | ~S/N | (too slow) | 93 dB |
| ADS852 | 14 | 65 | 75 | 100 dB | 85 dB | 100 |
| AD9240 | 14 | 10 | 79 | 90 | 81 | 90 |
| AD6640 | 12 | 65 | 66 | 80 | 76 | 80 |
| AD9042 | 12 | 41 | 67 | 80 | 75 | 80 |

DETAILED DESCRIPTION OF PREFERRED EMBODIMENT(S)

The present invention is directed to a receiver and a transmitter for a MRI transceiver. The design and operation of a preferred embodiment of the receiver will be addressed first. Thereafter, the design and operation of a preferred embodiment of the transmitter will be discussed.

A dynamic range on the order of 110 dB is preferred for MR receivers. However, such performance is not currently practical for known receivers. The issue is not whether an A/D with a sufficient number of bits (i.e., 20) can be constructed; in fact, such A/Ds are available. Rather, the issue is the maximum sampling rate, hence bandwidth, that can be achieved without excess degradation in quantization S/N or SFDR. For example, the performance of a 20-bit A/D may be guaranteed only for sample rates of 4 thousand samples-per-second (kSPS) or less, i.e., for a lowpass bandwidth of 4 kHz. This does not satisfy the desired 1.5 MHz maximum bandwidth requirement.

Another common point of confusion concerns the relationship between an A/D's rated S/N and the receiver's noise figure. In a well-designed system, the analog portion of the receiver preferably delivers a signal level close to the A/D's full scale value. For this condition, a 12-bit A/D can deliver a quantization S/N greater than 65 dB for the strongest in-band signal. This may be many orders of magnitude better than the S/N at the coil; thus, the A/D has no impact on the S/N performance of the receiver. The quantization S/N of the A/D does, however, impact the dynamic range of the receiver. For example, if one is interested in the weaker of two signals digitized by a receiver, then the quantization S/N of the A/D (including any digital IF processing behind it) must be greater than the power difference between the signals. Otherwise, the weaker signal will be lost in the quantization noise.

An interesting observation that can be made from Table 2 is that the word size (number of bits) does not provide a very good estimate of dynamic range. For example, based on the 16-bit word size of the AD1382, 98 dB of dynamic range (1.76 dB+6.02 dB/bit=16 bits) might be expected, but in fact this device is S/N-limited to about 93 dB when sampling a 200 kHz tone at 500 kSPS. Even in optimum conditions, the AD1382's S/N improves to no better than 95 dB. Thus, word size, by itself, is a poor criterion for A/D selection.

Note that Table 2 includes a column labeled "For acquisition of 1.5 MHz bandwidth". This value is calculated assuming that post-conversion (digital) filtering is used to obtain a signal with the optimum bandwidth and sample rate. This can be accomplished using a DDF. A popular implementation of the DDF is the cascaded-integrator-comb (CIC) technique. This form of DDF reduces the sample rate commensurate with the reduction in bandwidth, without generating significant aliasing, and is very computationally efficient. Proper implementation of DDFs dramatically improves the S/N of the A/D output. For example, consider the AD9042. It samples a signal at 41 MSPS with a 67 dB S/N. If a DDF is then used to reduce the sample rate to 3 MSPS, the effective quantization S/N improves by a factor of 0.5*(41/3), to 75 dB. Further examination leads to the interesting finding that the 14-bit ADS852 can yield better performance than the 16-bit AD1382 over the entire 2.5 kHz to 1.5 MHz bandwidth range.

Note that for bandwidths less than about 100 kHz, the dynamic range of the ADS852 is no longer constrained by quantization S/N, but rather by the SFDR, which is 100 dB for this particular device. The offending spurs result from subtle non-linearities in the A/D's transfer characteristic, and appear as weak discrete tones in the output spectrum. The traditional remedy for improving SFDR is a technique known as "dithering". Dithering is the addition of noise to the input of an A/D with the goal of distributing the spur energy more evenly over the spectrum of interest. The additional noise introduced by dithering can be mitigated by a number of appropriate techniques. One example technique is to band-limit the added noise such that it is present in the A/D's Nyquist bandwidth, but excluded from the passband of the desired MR signal. This is feasible for high-speed A/Ds because most of the Nyquist bandwidth is not used and therefore available for the injection of dithering noise.

Another advantage of high-speed oversampling A/Ds is that bandpass sampling becomes practical. Bandpass sampling involves sampling the signal of interest in real form, typically at an IF. An application of bandpass sampling for wideband MR receivers is discussed below.

The receiver of the present invention uses a wideband image canceling architecture that can be implemented at an IF (as opposed to baseband). The I and Q channels of an analog I/Q demodulator are acquired as bandpass signals and individually converted to complex baseband signals. In this form, independent manipulation of the wideband I and Q channels can be done using DSP techniques. In particular, the 90° phase shift required for image rejection can be implemented with ideal accuracy. The alternative, which occurs for traditional image canceling receivers, is to implement these phase shifts on signals in real form. As mentioned previously, this is difficult to do in a way that is frequency-independent. This is because a shift in the phase of a real signal must be implemented as a delay, and it is difficult (even in the digital domain) to develop a filter whose delay results in constant phase shift over a wide frequency band. In the digital domain, a phase shift on a wideband signal in real form requires a filter with a large number of multiplications for reasonable performance, whereas a phase shift on a wideband signal in complex baseband form can be implemented substantially exactly by a single multiplication.

This implementation and use of wideband IF image rejection in the present invention is unique. One known system uses IF image rejection in wideband receivers for radio astronomy. However, that system uses analog phase shifts at the IF (as opposed to generating two complex baseband signals), and it relies on small fractional bandwidth to avoid the problem of frequency-varying phase. Another known system uses a wideband IF image rejection receiver for low-power wireless communications. That design is an analog implementation using a second tier of mixers to generate complex baseband signals, followed by lowpass (quadrature) sampling.

Figure 2:
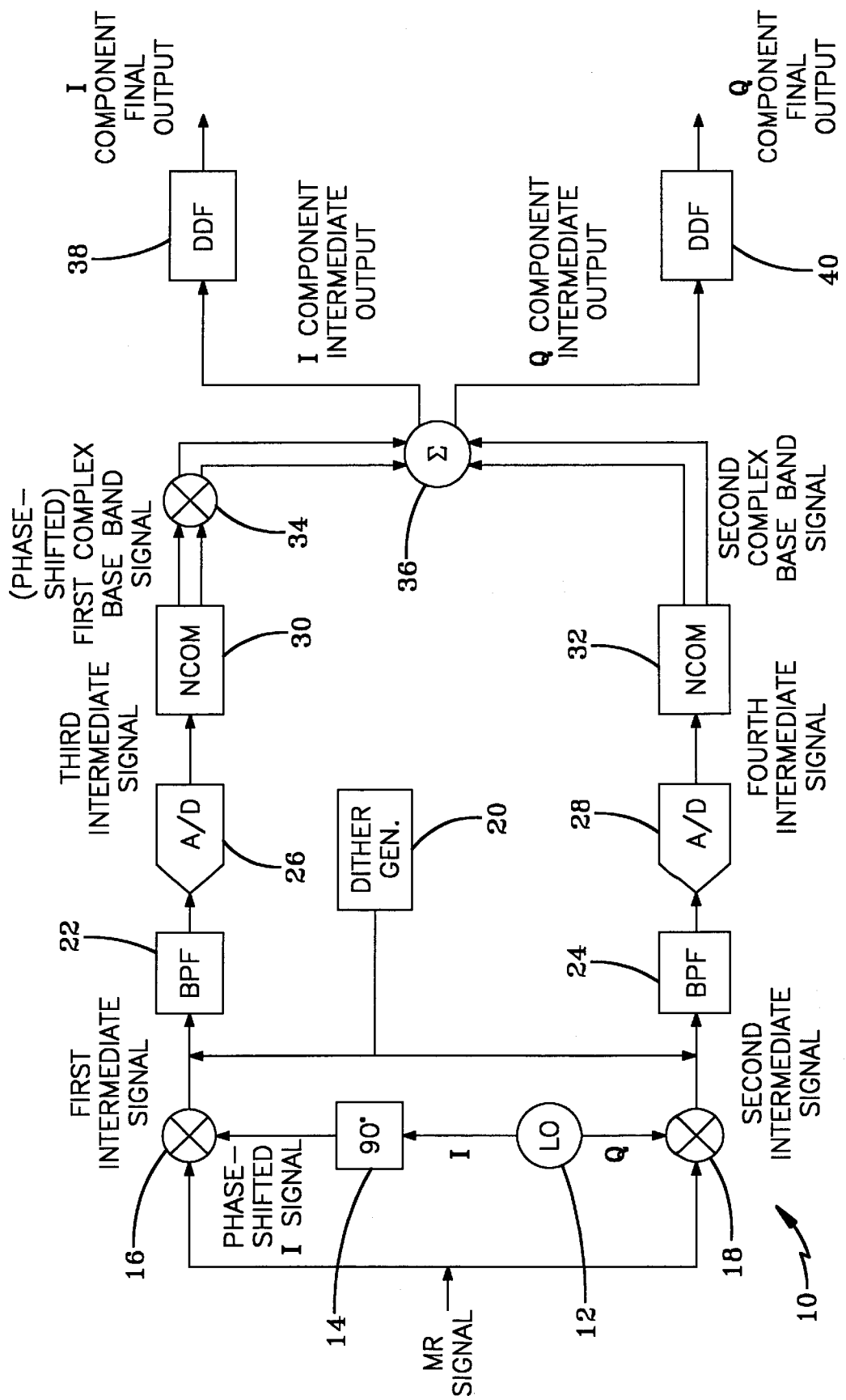
FIG. 2 is a diagram of a preferred embodiment of a receiver of the present invention.

A preferred embodiment of the receiver 10 of the present invention is shown in FIG. 2. In this embodiment, the analog I/Q demodulation/downconversion is to an IF within the Nyquist bandwidth of preferably high-speed A/Ds and digitized in quadrature. The signals are then converted to independent complex baseband channels digitally.

As shown in FIG. 2, the local oscillator 12 produces an I signal and a Q signal. The phase shifting device 14 causes a 90° phase shift of the I signal. The first mixer 16 mixes a MR signal with the output of the phase shifting device 14, and the second mixer 18 mixes the MR signal and the Q signal.

The receiver 10 includes means for improving SFDR. In particular, a dithering generator 20 adds noise to the output of the first mixer 16 and the output of the second mixer 18. The dithered outputs are then filtered by bandpass filters 22, 24. The first bandpass filter 22 filters the output of the first mixer 16, and the second bandpass filter 24 filters the output of the second mixer 18. The output of the first bandpass filter 22 is then digitized by the first A/D 26. Meanwhile, the second A/D 28 digitizes the output of the second bandpass filter 24.

The first NCOM 30 downconverts the output of the first A/D 26 to a first complex baseband signal, and the second NCOM 32 downconverts the output of the second A/D 28 to a second complex baseband signal. In addition, the first NCOM 30 causes a 90° phase shift of the first complex baseband signal. The phase shift may be positive or negative depending on whether the upper sideband ($f_{LO}+f_{IF}$) or the lower sideband ($f_{LO}-f_{IF}$) is desired. This is preferably a programmable feature of the first NCOM 30. The receiver 10 then corrects phase and amplitude imbalance which may occur due to variation in gain and electrical length between the analog mixer outputs and the A/D inputs. In particular, the receiver 10 includes a multiplier 34 that multiplies the output of the first NCOM 30 by a signal, e.g., a complex constant, to produce desired gain and phase corrections. The correction signal is preferably provided by a DSP. However, it should be recognized that the correction signal may be provided by any suitable device or circuit.

The outputs of the multiplier 34 and the second NCOM 32 are added to complete the image cancellation. DDFs 38, 40 are then used to select the desired bandwidth-sample rate combination. The first DDF 38 decimates an I component of the output of the adder 36 to a desired sample rate and a desired bandwith, and the second DDF 40 decimates a Q component of the output of the adder 36 to the desired sample rate and the desired bandwith. As a result, the outputs of the first DDF 38 and the second DDF 40 are adapted for use by the MRI system control/console.

The receiver 10 may include a DSP that receives the outputs of the first DDF 38 and the second DDF 40. In addition to providing the correction signal to the multiplier 34, the DSP may coordinate administrative, buffering, and data distribution tasks. In addition, the DSP preferably provides signal processing of the outputs of the first DDF 38 and the second DDF 40.

The local oscillator 12 may be any appropriate circuit or device which is adapted to produce a radio frequency I and Q signal. An example of a local oscillator 12 is a PTS-1000 which is available from Programmable Test Sources, Inc.

The phase shifting device 14 is preferably a quadrature hybrid. An example of a phase shifting device 14 is a MIA-COM JH-131. However, it should be recognized that the phase device 14 may be any suitable circuit or device that is adapted to cause the desired phase shift.

The first mixer 16 and the second mixer 18 may be any appropriate circuit or device that is adapted to combine two signals of different frequencies to produce a third signal. An example of a first mixer 16 and a second mixer 18 is a HMJ5 which is available from Watkins-Johnson.

Dithering generators are known in the art. The dithering generator 20 may be any circuitry or device which is appropriate for dithering. A preferred embodiment of the dithering generator 20 is comprised of a Noise/Com NC202 noise diode and a Burr-Brown OPA643 amplifier.

Bandpass filters are also known in the art. It is preferred that the bandpass filters 22, 24 are custom-built to meet the performance specifications of the receiver. TTE, Inc. of Los Angeles, Calif. is an example of a company that builds lowpass and bandpass filters according to customer specifications.

The A/Ds 26, 28 may be any A/D which is adapted to provide sufficient performance over the desired bandwidth range. An example of A/Ds 26, 28 is a 14-bit ADS852.

NCOMs 30, 32 may be any circuitry or device that can perform the desired downconversion. One example of an NCOM 30, 32 is the Harris HSP45116. Because the NCOMs are digital devices, they preferably yield superior linearity and I/Q balance. In a preferred embodiment of the receiver, the NCOMs have internally generated LOs. As a result, no additional external LOs need to be synthesized. Further, the relative phase of the internal LOs can be precisely manipulated, offering increased flexibility in sideband selection as well as correction of errors incurred in the analog front end.

The multiplier 34 is preferably a digital complex multiplier. An example of a multiplier 34 is a Harris HMU17. However, it should be recognized that the multiplier 34 may be any appropriate device or circuit that is adapted to perform desired multiplication of complex digital signals.

Those skilled in the art will recognize that the adder 36 may be any appropriate device or circuit that is adapted to add complex digital signals. An example of the adder 36 is implemented in VHSIC (very high speed integrated circuits) hardware description language (VHDL) on a field-programmable gate array (FPGA).

The DDFs 38, 40 may be any appropriate device or circuit that is adapted to decimate a digital signal to a desired sample rate and bandwidth. An example of the DDFs 38, 40 is a HSP43220 DDF.

The Graychip GC4014 provides another example of the NCOMs 30, 32, the adder 36, and the DDFs 38, 40. The Graychip GC4014 includes four channels (that is, four NCOMs, each followed by a pair of DDFs) plus summing. Consequently, much of the receiver can be implemented in a single chip.

Figure 3:
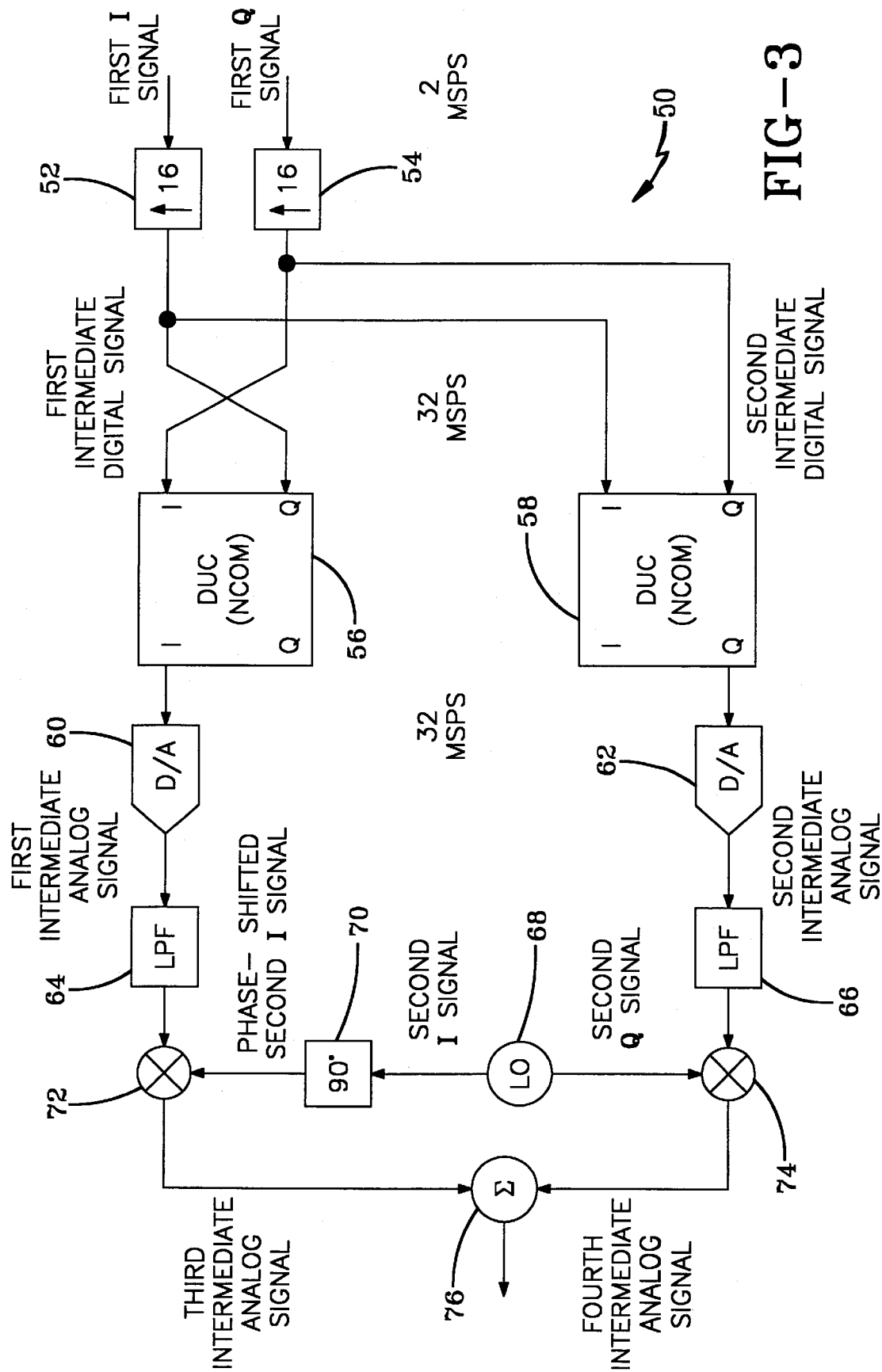
FIG. 3 is a diagram of a preferred embodiment of a transmitter of the present invention.

A preferred embodiment of the transmitter 50 of the present invention is shown in FIG. 3. This embodiment of the transmitter 50 is suitable for UHFMRI. In this example, an arbitrary function generator of a MRI system control/console outputs a waveform in complex baseband form of up to about 1 MHz bandwidth at 2 MSPS. However, it should be recognized that the waveform may be generated by any suitable source, and it may have any bandwidth and sample rate which is appropriate for the application, e.g., up to 2 MSPS representing a waveform with bandwidth up to about 1.5 MHz.

The waveform is comprised of an I signal and a Q signal. The first DIF 52 interpolates the I signal by a power of 2, e.g., 16, and the second DIF 54 interpolates the Q signal by the same factor. For example, interpolating the I and Q signals of this example by 16 results in the same signals except at an increased sample rate of 32 MSPS.

Figure 4:
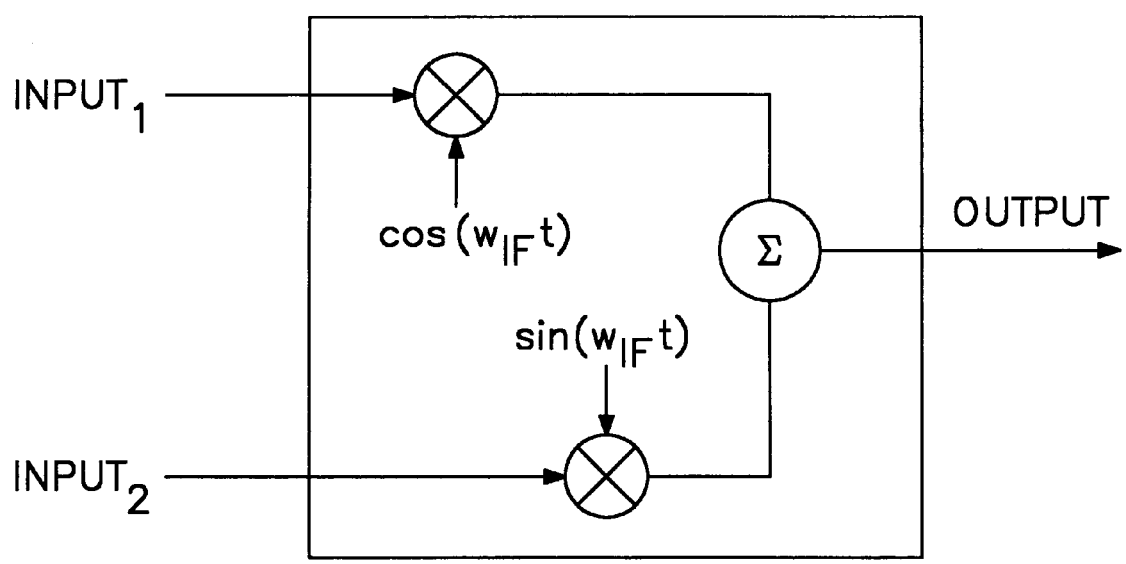
FIG. 4 is a diagram showing an example of how an NCOM can be used as a DUC.

The complex baseband signal is then digitally upconverted using DUCs. This example uses NCOMs as DUCs, which commonly have real-valued outputs. FIG. 4 shows an example of how an NCOM can be used as a DUC. NCOMs commonly have complex-valued outputs. In light of this feature of NCOMs, the I component of the output of one NCOM may be used as the real-valued, upconverted bandpass output signal. In addition, when implemented as shown in FIG. 3, the Q component of the output of another NCOM may be used for image rejection.

Referring back to FIG. 3, the first DUC 56 and the second DUC 58 are in electrical communication with the first DIF 52 and the second DIF 54, respectively. The first DUC 56 has a first I input and a first Q input. The input signals to the first DUC 56 are swapped. In particular, the first I input of the first DUC 56 receives the output of the second DIF 54, and the first Q input of the first DUC 56 receives the output of the first DIF 52. Similarly, the second DUC 58 has a second I input and a second Q input. However, the second I input of the second DUC 58 receives the output of the first DIF 52, and the second Q input of the second DUC 58 receives the output of the second DIF 54. By swapping the I and Q inputs to the first DUC 56, a 90° phase shift is imparted on one channel. Thus, when the outputs of the first DUC 56 and the second DUC 58 are used as shown in FIG. 3, the difference frequency $f_{LO}-f_{IF}$ is canceled, leaving only the desired sideband $f_{LO+}f_{IF}$.

The first D/A 60 converts the I output of the first DUC 56 to wideband analog form, and the second D/A 62 converts the Q output of the second DUC 58 to wideband analog form.

The desired amount of interpolation by the DIFs 52, 54 is related to the performance of the D/As 60, 62 and the DUCs 56, 58. It is desired to sample the D/As 60, 62 as fast as possible in order to simplify anti-alias filtering. Thus, the DUCs 56, 58 are also preferably fast. Because interpolation is easiest to implement for integer-valued rate conversion, interpolating by 16 in this example to achieve a sample rate of 32 MSPS is a preferred choice.

Like A/Ds, the dynamic range of D/As for MR applications may be generally characterized by word size (number of input bits). However, while word size may set theoretical constraints on D/A quantization S/N and resolution, it cannot be used to accurately characterize the ultimate performance of the D/A. As in the case of A/Ds, this is particularly true for high-speed D/As. Some candidate D/As, all rated for operation at 30 MSPS or higher, are shown in Table 3. Note that despite increasing S/N with word length, the 12-bit D/A actually shows the best SFDR. However, glitch energy may seriously degrade the performance of both the 16-bit and 12-bit D/A. On this basis, the 14-bit Harris HI5741 D/A is a preferred choice for this transmitter architecture. However, it should be recognized that D/As 60, 62 may be any D/A which provides sufficient performance for the application.

TABLE 3

Candidate D/As

| D/A | Word Size | S/N | Glitch Energy | Rated Performance to Nyquist | | |
|---|---|---|---|---|---|---|
| | | | | Speed | $f_{OUT}$ | SFDR |
| AD768 | 16 bits | 98 dB | 35 pV-s | 20 MSPS | 1 MHz | 73 dB |
| H15741 | 14 | 86 | 1 | 25 | 2 | 77 |
| AD9762 | 12 | 74 | 5 | 25 | 1 | 79 |

This embodiment of the transmitter 50 includes lowpass filtering. The first lowpass filter 64 filters the output of the first D/A 60, and the second lowpass filter 66 filters the output of the second D/A 62. The transmitter 50 includes a local oscillator 68 or another suitable device or circuit which produces a second I signal and a second Q signal. An example of a local oscillator 68 is a PTS-1000 which is available from Programmable Test Sources, Inc. A phase shifting device 70 is in electrical communication with the local oscillator 68. The phase shifting device 70 is adapted to cause a 90° phase shift of the second I signal. The first mixer 72 mixes the output of the first lowpass filter 64 and the output of the phase shifting device 70. Meanwhile, the second mixer 74 mixes the output of the second lowpass filter 66 and the second Q signal of the local oscillator 68. A combiner is in electrical communication with the first mixer and the second mixer. The combiner 76 then adds the outputs of the first mixer 72 and the second mixer 74 to produce a RF excitation signal.

A preferred embodiment of the transmitter 50 may also include a DSP. The DSP may be placed in electrical communication with the first DIF 52 and the second DIF 54 for performing signal processing on the first I signal and the first Q signal. The first I signal and the first Q signal may then be input to the first DIF 52 and the second DIF 54.

DIFs are known in the art. Each of the DIFs 52, 54 may be comprised of any circuit or device that is adapted to interpolate a digital signal by an appropriate factor. A preferred example of the DIFs 52, 54 is implemented in VHDL on a FPGA.

The first DUC 56 and the second DUC 58 may each be comprised of a NCOM or any other appropriate device or circuit for performing digital upconversion. An example of the first DUC 56 and the second DUC 58 is the 33 MSPS version of the Harris HSP45116.

Like bandpass filters, lowpass filters are known in the art. It is preferred that the lowpass filters 64, 66 are custom-built to meet the performance specifications of the transmitter. As previously mentioned, TTE, Inc. of Los Angeles, Calif. custom builds lowpass filters that may be used in the present invention.

The phase shifting device 70 is preferably a quadrature hybrid. An example of a phase shifting device 70 is a M/A-COM JH-131. However, it should be recognized that the phase device 70 may be any suitable circuit or device that is adapted to cause the desired phase shift.

The mixers 72, 74 may be comprised of any appropriate circuit or device that is adapted to combine two signals of different frequencies to produce a third signal. An example of a first mixer 72 and a second mixer 74 is a HMJ5 which is available from Watkins-Johnson.

Those skilled in the art will recognize that the combiner 76 may be any appropriate device or circuit that is adapted to add analog signals. An example of the combiner 76 is part number ZESC-2-11 which is available from Mini-Circuits of Brooklyn, N.Y.

The receiver 10 and/or the transmitter 50 may require some additional support elements for desired functionality depending on the application. In addition, the receiver 10 and the transmitter 50 may be integrated into a complete magnetic resonance spectrometer. However, it should be recognized that the receiver 10 and the transmitter 50 may be used alone or in combination in other appropriate applications which require a receiver and/or a transmitter.

The remainder of the description will be directed to integrating a receiver and a transmitter of the present invention into one embodiment of a complete magnetic resonance spectrometer. Control is preferably provided for changing the frequency of the shared LO (FIGS. 2 and 3) to effect transmitter and receiver tuning. The transmitter (FIG. 3) is also preferably provided with two digital arbitrary functions for I and Q modulation of the LO to produce the output RF. In addition, the receiver (FIG. 2) DDFs are preferably programmed to produce samples with the requested decimation. Not shown, a trigger is preferred, as is a programmable counter, to limit the number of samples per trigger. The trigger preferably resets the sample counter and synchronizes the DDFs so samples are acquired with the same timing from one trigger to the next. Diagnostics are preferably provided so higher level software can deal with exceptional conditions. For example, if the counter has not yet counted down to zero when the next trigger is received, then fewer than expected samples will be propagated. The A/Ds may provided with overrange detection. Since a few spurious overrange indications may occur when running near the limit of the A/Ds, a running count of overrange samples can be provided with the qualitative analysis left to higher levels of software or an operator.

The receiver of the present invention preferably includes a management system. A dedicated embedded computer may be utilized for this function. Higher levels of the system may program parameters over a serial port attached to the embedded computer. The embedded computer can be used for development before the transceiver is ready for integration with other components. In addition, the embedded computer and the serial interface can provide a standardized view of underlying hardware.

Figure 5:
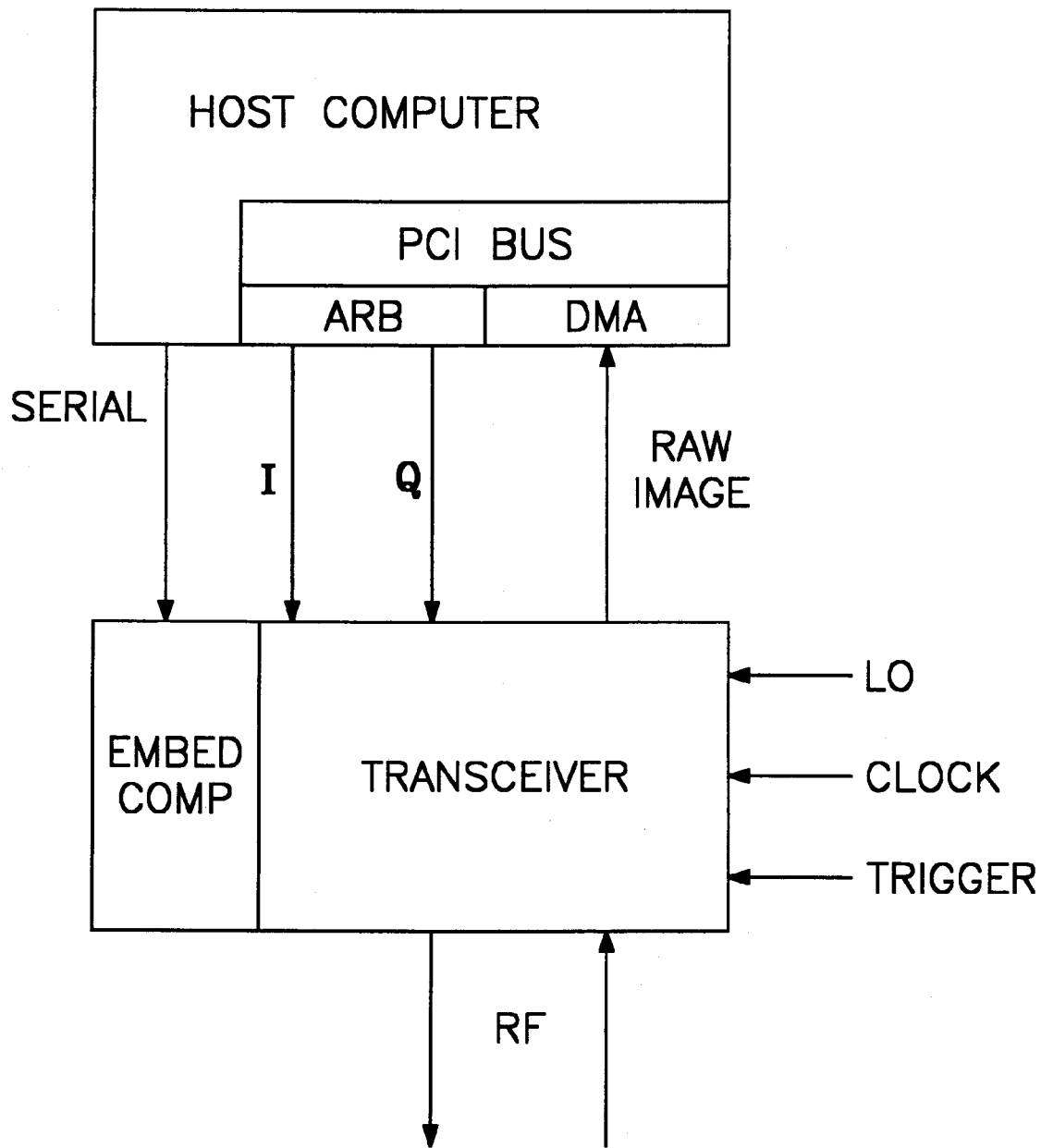
FIG. 5 is a diagram of a preferred embodiment of a transceiver host computer of the present invention.

In the example of FIG. 5, one multiprocessor Pentium PC is used per transceiver. The I and Q arbitrary functions may be generated in PC software and delivered to the transmitter using a PCI-bus synchronous FIFO card. The receiver preferably delivers data to a PCI-bus direct memory access (DMA) card residing in the PC. The system preferably allows time data to be continuously streamed from the receiver into PC main memory and optionally to disk. This preferably allows single data sets to be limited in size only by the available disk space.

The receiver and the transmitter of the present invention may be utilized in a single or multiple transceiver system. If desired, the transceiver may be a networked instrument.

The preferred embodiments herein disclosed are not intended to be exhaustive or to unnecessarily limit the scope of the invention. The preferred embodiments were chosen and described in order to explain the principles of the present invention so that others skilled in the art may practice the invention. Having shown and described preferred embodiments of the present invention, those skilled in the art will realize that many variations and modifications may be made to affect the described invention. Many of those variations and modifications will provide the same result and fall within the spirit of the claimed invention. It is the intention, therefore, to limit the invention only as indicated by the scope of the claims.

What is claimed is:

1. A receiver for an MRI transceiver, said receiver adapted to convert a magnetic resonance (MR) signal to digital data for use by a MRI system control/console, said receiver comprising:

a local oscillator adapted to produce an in-phase (I) signal and a quadrature (Q) signal;

a phase shifting device in electrical communication with said local oscillator, said phase shifting device adapted to cause a 90° phase shift of said I signal;

a first mixer in electrical communication with said phase shifting device, said first mixer adapted to mix said MR signal and the output of said phase shifting device;

a second mixer in electrical communication with said local oscillator, said second mixer adapted to mix said MR signal and said Q signal;

a first analog-to-digital converter (A/D) in electrical communication with said first mixer, said first A/D adapted to digitize the output of said first mixer, a second A/D in electrical communication with said second mixer, said second A/D adapted to digitize the output of said second mixer;

a first numerically controlled oscillator/modulator (NCOM) in electrical communication with said first mixer, said first NCOM adapted to downconvert the output of said first A/D to a first complex baseband signal, said first NCOM further adapted to cause a 90° phase shift of said first complex baseband signal;

a second NCOM in electrical communication with said second mixer, said second NCOM adapted to downconvert the output of said second A/D to a second complex baseband signal;

an adder in electrical communication with said first NCOM and said second NCOM, said adder adapted to add said first complex baseband signal and said second complex baseband signal;

a first digital decimation filter (DDF) in electrical communication with said adder, said first DDF adapted to decimate an I component of the output of said adder to a desired sample rate and a desired bandwith; and a second (DDF) in electrical communication with said adder, said second DDF adapted to decimate a Q component of the output of said adder to said desired sample rate and said desired bandwith;

wherein the outputs of said first DDF and said second DDF are adapted for use by said MRI system control/console.

2. The receiver of claim 1 further comprising:

a dithering generator adapted to add noise to the output of said first mixer and the output of said second mixer;

a first bandpass filter in electrical communication with said first mixer, said first bandpass filter adapted to filter the output of said first mixer; and a second bandpass filter in electrical communication with said second mixer, said second bandpass filter adapted to filter the output of said second mixer;

wherein the output of said first bandpass filter is input to said first A/D; and wherein the output of said second bandpass filter is input to said second A/D.

3. The receiver of claim 1 further comprising:

a first bandpass filter in electrical communication with said first mixer, said first bandpass filter adapted to filter the output of said first mixer; and a second bandpass filter in electrical communication with said second mixer, said second bandpass filter adapted to filter the output of said second mixer;

wherein the output of said first bandpass filter is input to said first A/D; and wherein the output of said second bandpass filter is input to said second A/D.

4. The receiver of claim 1 further comprising:

a multiplier in electrical communication with said first NCOM, said multiplier adapted to multiply the output of said first NCOM by a signal from a digital signal processor to produce desired gain and phase corrections;

wherein the output of said multiplier is added to the output of said second NCOM by said adder.

5. The receiver of claim 4 wherein said multiplier is a digital complex multiplier.

6. The receiver of claim 1 further comprising:

a digital signal processor (DSP) in electrical communication with said first DDF and said second DDF, said DSP adapted to receive the outputs of said first DDF and said second DDF, said DSP further adapted to coordinate administrative, buffering, and data distribution tasks.

7. The receiver of claim 6 wherein said DSP is also adapted to provide signal processing of the outputs of said first DDF and said second DDF.

8. The receiver of claim 1 wherein said phase shifting device is a quadrature hybrid.

9. A method for converting a magnetic resonance (MR) signal to digital data for use by a MRI system control/console, said method comprising:

providing a magnetic resonance (MR) signal;

providing an in-phase (I) signal and a quadrature (Q) signal;

shifting the phase of said I signal by 90°;

mixing the phase-shifted I signal and said MR signal to produce a first intermediate signal;

mixing said Q signal and said MR signal to produce a second intermediate signal;

digitizing said first intermediate signal to produce a third intermediate signal;

digitizing said second intermediate signal to produce a fourth intermediate signal;

downconverting said third intermediate signal to produce a first complex baseband signal;

downconverting said fourth intermediate signal to produce a second complex baseband signal;

shifting the phase of said first complex baseband signal by 90°;

adding the phase-shifted first complex baseband signal and said second complex baseband signal to produce an I component intermediate output and a Q component intermediate output;

decimating said I component intermediate output to an I component final output having a desired sample rate and a desired bandwidth; and decimating said Q component intermediate output to a Q component final output having said desired sample rate and said desired bandwidth;

wherein said I component final output and said Q component final output are adapted for use by said MRI system control/console.

10. The method of claim 9 further comprising:

dithering said first and second intermediate signals; and bandpass filtering said first and second intermediate signals;

whereby said first and second intermediate signals are adapted to be digitized.

11. The method of claim 9 further comprising:

bandpass filtering said first and second intermediate signals;

whereby said first and second intermediate signals are adapted to be digitized.

12. The method of claim 9 further comprising:

multiplying the phase-shifted first complex baseband signal by a suitable signal to produce desired gain and phase corrections;

whereby the phase-shifted first complex baseband signal is adapted to be added to said second complex baseband signal.

13. The method of claim 9 further comprising:

signal processing said I component final output and said Q component final output;

whereby said I component final output and said Q component final output are adapted for use by said MRI system control/console.

14. A transmitter for an MRI transceiver, said transmitter adapted to generate radio frequency (RF) excitation signals from the digital output of a MRI system control/console, said transmitter comprising:

a first digital interpolation filter (DIF) adapted to receive a first in-phase (I) signal from said MRI system control/console, said first DIF adapted to interpolate said first I signal by a desired factor;

a second DIF adapted to receive a first quadrature (Q) signal from said MRI system control/console, said second DIF adapted to interpolate said first Q signal by said desired factor;

a first digital upconverter (DUC) in electrical communication with said first DIF and said second DIF, said first DUC having a first I input and a first Q input, said first I input of said first DUC adapted to receive the output of said second DIF, said first Q input of said first DUC adapted to receive the output of said first DIF;

a second DUC in electrical communication with said first DIF and said second DIF, said second DUC having a second I input and a second Q input, said second I input of said second DUC adapted to receive the output of said first DIF, said second Q input of said second DUC adapted to receive the output of said second DIF;

a first digital-to-analog converter (D/A) in electrical communication with said first DUC, said first D/A adapted to convert an I output of said first DUC to analog form;

a second D/A in electrical communication with said second DUC, said second D/A adapted to convert a Q output of said second DUC to analog form;

a local oscillator adapted to produce a second I signal and a second Q signal;

a phase shifting device in electrical communication with said local oscillator, said phase shifting device adapted to cause a 90° phase shift of said second I signal;

a first mixer in electrical communication with said first D/A and said phase shifting device, said first mixer adapted to mix the output of said first D/A and the output of said phase shifting device;

a second mixer in electrical communication with said second D/A and said local oscillator, said second mixer adapted to mix the output of said second D/A and said second Q signal of said local oscillator; and a combiner in electrical communication with said first mixer and said second mixer, said combiner adapted to add the outputs of said first mixer and said second mixer.

15. The transmitter of claim 14 further comprising:

a first lowpass filter in electrical communication with said first D/A, said first lowpass filter adapted to filter the output of said first D/A; and a second lowpass filter in electrical communication with said second D/A, said second lowpass filter adapted to filter the output of said second D/A;

wherein the output of said first lowpass filter is input to said first mixer; and wherein the output of said second lowpass filter is input to said second mixer.

16. The transmitter of claim 14 wherein said desired factor is a power of 2.

17. The transmitter of claim 14 wherein said first DUC and said second DUC are each comprised of a numerically controlled oscillator/modulator (NCOM).

18. The transmitter of claim 14 wherein said phase shifting device is a quadrature hybrid.

19. The transmitter of claim 14 further comprising:

a digital signal processor (DSP) in electrical communication with said first DIF and said second DIF, said DSP adapted to perform signal processing on said first I signal and said first Q signal;

whereby said first I signal and said first Q signal are adapted to be input to said first DIF and said second DIF.

20. A method for generating radio frequency (RF) excitation signals from the digital output of a MRI system control/console, said method comprising:

providing a first in-phase (I) signal and a first quadrature (Q) signal from said MRI system control/console;

interpolating said first I signal by a desired factor to produce a first intermediate digital signal;

interpolating said first Q signal by said desired factor to produce a second intermediate digital signal;

providing a first digital upconverter (DUC) and a second DUC, said first DUC having a first I input and a first Q input, said second DUC having a second I input and a second Q input;

providing said first intermediate digital signal to said first Q input of said first DUC and said second I input of said second DUC;

providing said second intermediate digital signal to said first I input of said first DUC and said second Q input of said second DUC;

converting an I output of said first DUC to a first intermediate analog signal;

converting a Q output of said second DUC to a second intermediate analog signal;

generating a second I signal and a second Q signal;

shifting the phase of said second I signal by 90°;

mixing the phase-shifted second I signal and said first intermediate analog signal to produce a third intermediate analog signal;

mixing said second Q signal and said second intermediate analog signal to produce a fourth intermediate analog signal; and combining said third intermediate analog signal and said fourth intermediate analog signal.

21. The method of claim 20 further comprising:

lowpass filtering said first intermediate analog signal and said second intermediate analog signal;

whereby said first intermediate analog signal is adapted to be mixed with the phase-shifted second I signal; and whereby said second intermediate analog signal is adapted to be mixed with said second Q signal.

22. The method of claim 20 wherein said desired factor is a power of 2.

23. The method of claim 20 further comprising:

signal processing said first I signal and said first Q signal;

whereby said first I signal and said first Q signal are adapted to be interpolated.

* * * * *

UNITED STATES PATENT AND TRADEMARK OFFICE
CERTIFICATE OF CORRECTION

PATENT NO.         : 6,259,253 B1
APPLICATION NO. : 09/329507
DATED              : July 10, 2001
INVENTOR(S)       : Steven W. Ellingson It is certified that error appears in the above-identified patent and that said Letters Patent is hereby corrected as shown below:

In column 2, Table 1, line 25, please delete the following reference "$^{27}$M" and replace it with -- $^{27}$Al --;

In column 10, line 44, please delete the following reference "MIA" and replace it with -- M/A --;

In column 12, Table 3, line 43, please delete the following reference "H15741" and replace it with -- HI5741 --.

Signed and Sealed this

Fifth Day of December, 2006

JON W. DUDAS
*Director of the United States Patent and Trademark Office*